(12) United States Patent
Choi

(10) Patent No.: US 6,229,362 B1
(45) Date of Patent: May 8, 2001

(54) CHARGE PUMP FOR ADAPTIVELY CONTROLLING CURRENT OFFSET

(75) Inventor: Dong-myung Choi, Seongnam (KR)

(73) Assignee: Samsung Electronics, Co. Ltd., Kyunggi-do (KR)

( * ) Notice: Subject to any disclaimer, the term of this patent is extended or adjusted under 35 U.S.C. 154(b) by 0 days.

(21) Appl. No.: 09/334,134

(22) Filed: Jun. 15, 1999

(30) Foreign Application Priority Data

Jul. 29, 1998 (KR) .................................................. 98-30683
Apr. 15, 1999 (KR) .................................................. 99-13327

(51) Int. Cl.$^7$ ....................................................... H03L 7/06
(52) U.S. Cl. ........................................... 327/157; 327/159
(58) Field of Search .................................... 327/112, 147, 327/148, 150, 156, 157, 159, 536; 331/17; 375/373–376

(56) References Cited

U.S. PATENT DOCUMENTS

| | | | |
|---|---|---|---|
| 5,508,660 | * | 4/1996 | Gersbach et al. ..................... 327/157 |
| 5,592,120 | * | 1/1997 | Palmer et al. ........................ 327/157 |
| 5,646,563 | | 7/1997 | Kuo ...................................... 327/157 |
| 5,801,578 | * | 9/1998 | Bereza ................................. 327/157 |
| 5,929,677 | * | 7/1999 | Murata ................................. 327/157 |
| 5,949,264 | * | 9/1999 | Lo ........................................ 327/157 |
| 6,054,882 | * | 4/2000 | Izumikawa ........................... 327/157 |

* cited by examiner

Primary Examiner—My-Trang Nuton
(74) Attorney, Agent, or Firm—Samuels, Gauthier & Stevens LLP

(57) ABSTRACT

A charge pump systematically compensating for the deviation of output pumping current is provided. In the charge pump, a first current source supplies first current of the same level through first and second channels, and a second current source supplies second current of the same level through third and fourth channels. First switching means is connected between the first channel of the first current source and an output node, and is turned on in response to the first signal from a phase detector to output the first current as the first pumping current through the output node. Second switching means is connected between the output node and the third channel of the second current source, and is turned on in response to the second signal from the phase detector to output the second current as the second pumping current through the output node. The current controller is connected to the second channel of the first current source and the fourth channel of the second current source, and controls the second current source such that the first pumping current level in activation is equal to the second pumping current level in activation.

9 Claims, 8 Drawing Sheets

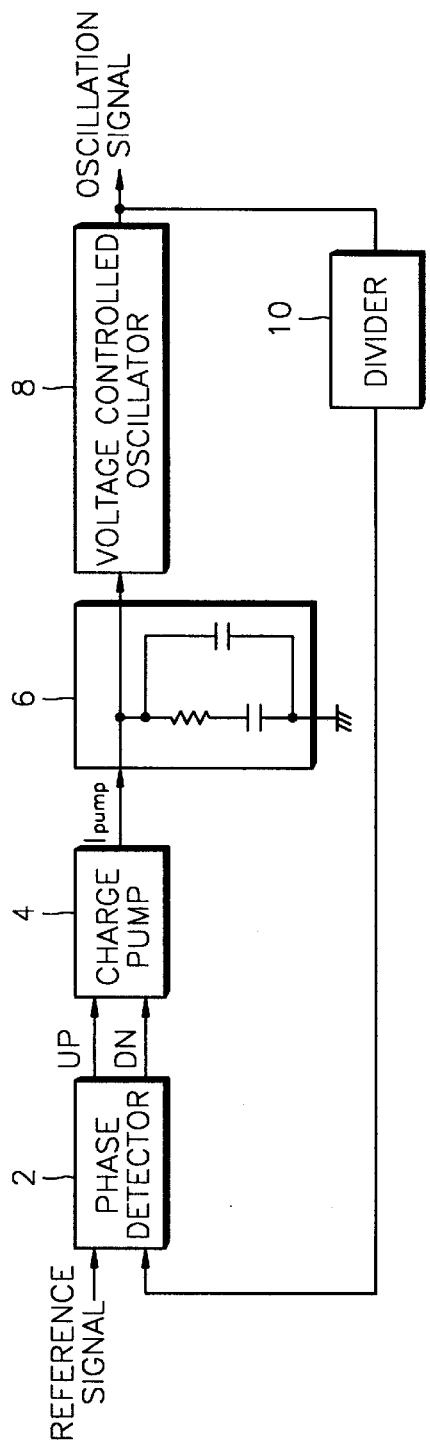
FIG. 1 (PRIOR ART)
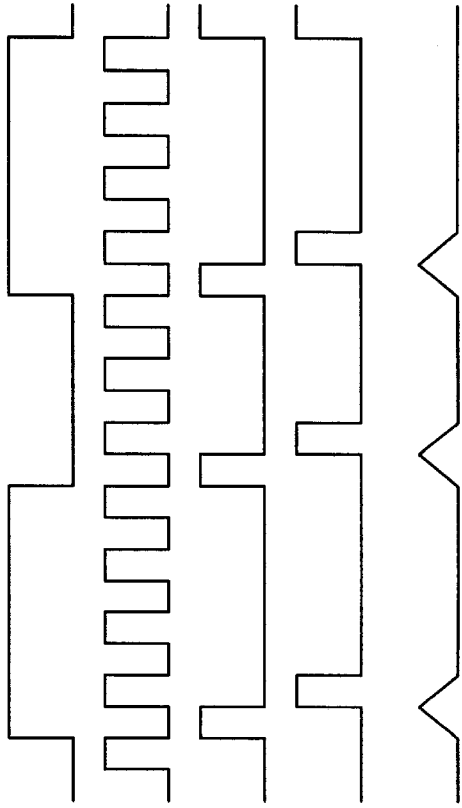
FIG. 2A  REFERENCE SIGNAL
FIG. 2B  DIVIDED OSCILLATION SIGNAL
FIG. 2C  UP-SIGNAL
FIG. 2D  DN-SIGNAL
FIG. 2E  VCO CONTROL SIGNAL

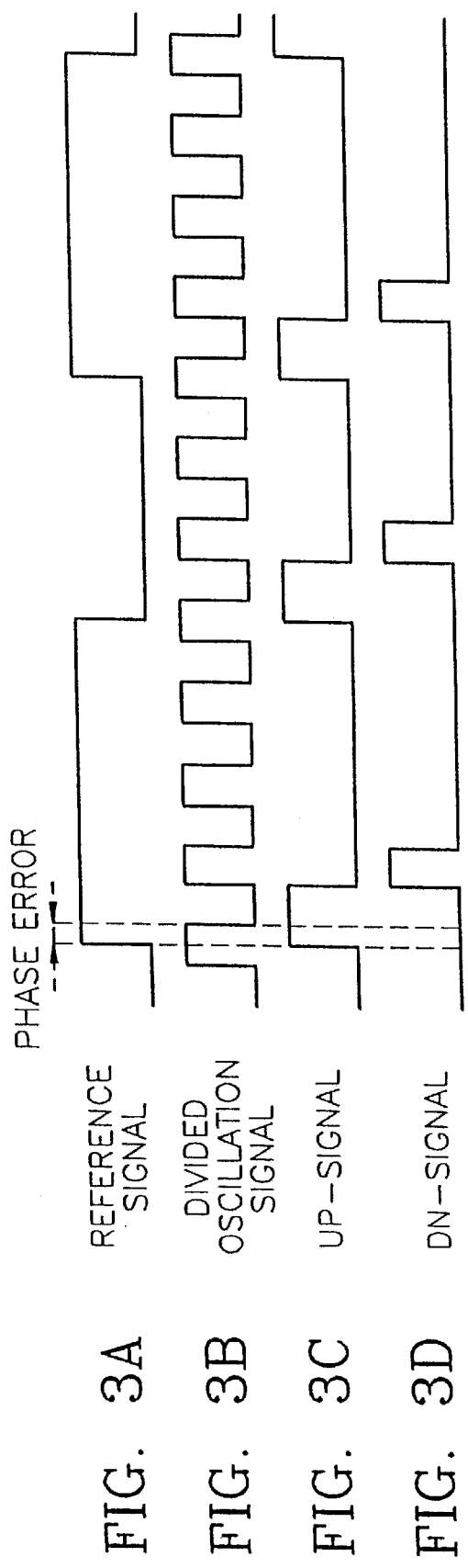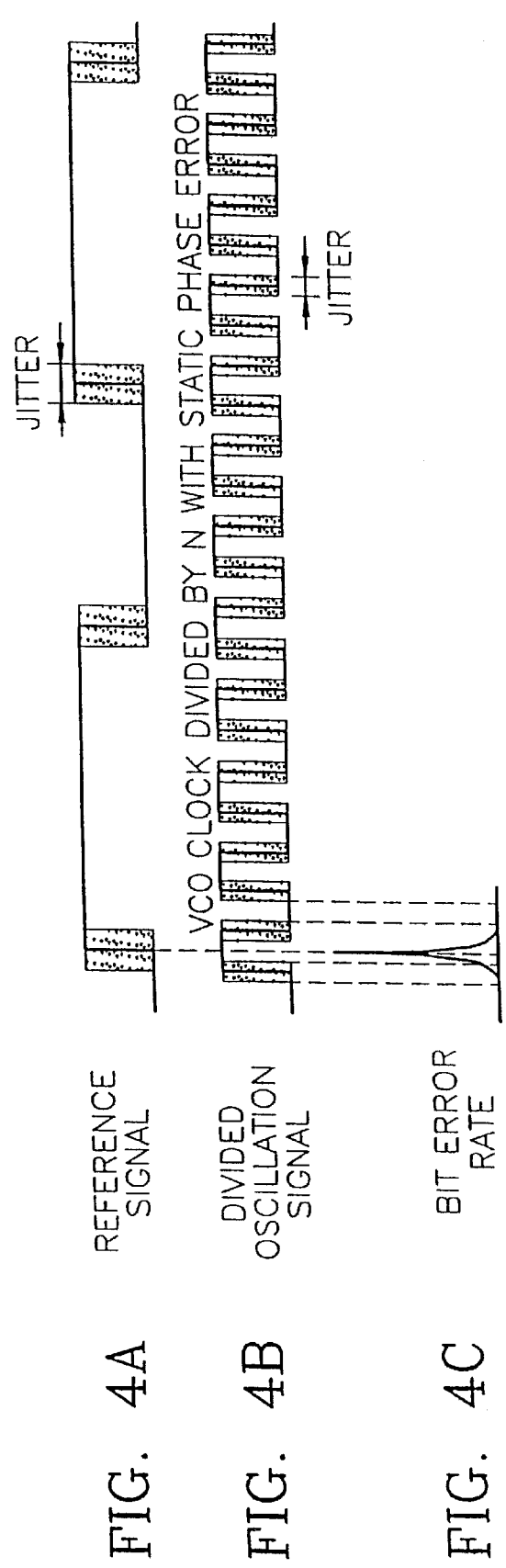

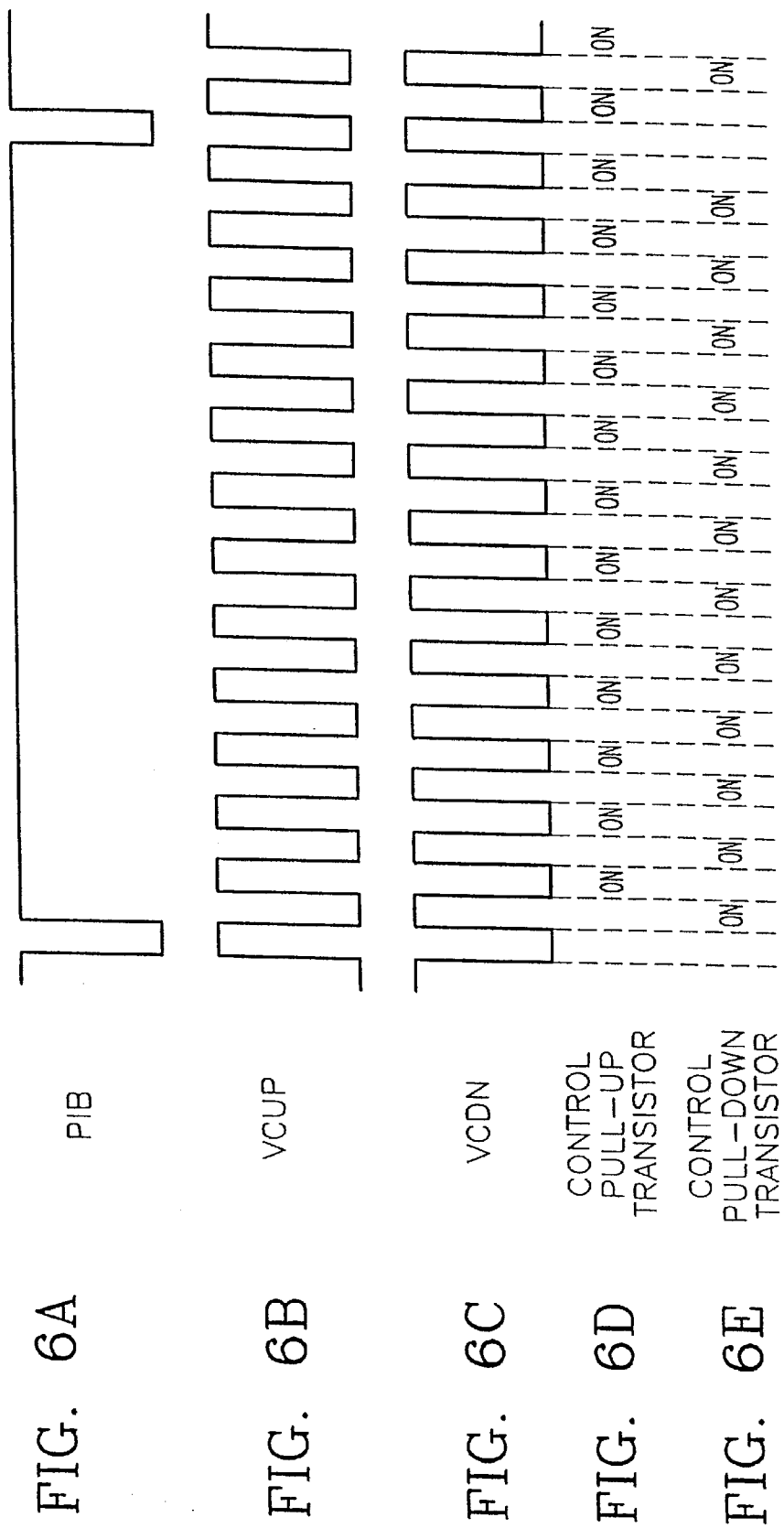

FIG. 7A  VA
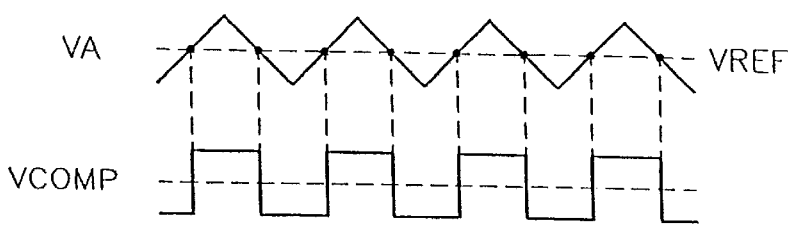
FIG. 7B  VCOMP
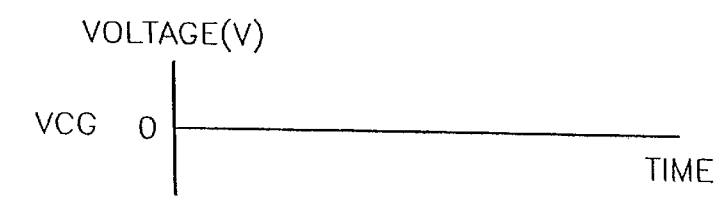
FIG. 7C  VCG
FIG. 8A  VA
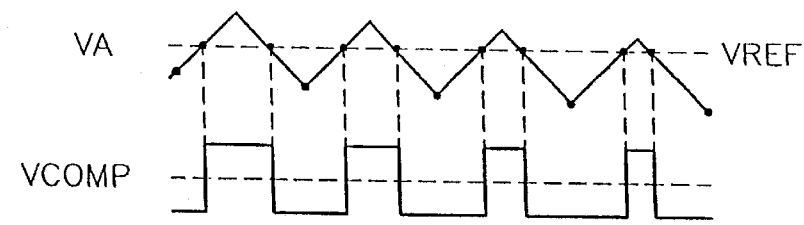
FIG. 8B  VCOMP
FIG. 8C  VCG

CHARGE PUMP FOR ADAPTIVELY CONTROLLING CURRENT OFFSET

BACKGROUND OF THE INVENTION

1. Field of the Invention

The present invention relates to a phase-locked loop (PLL) circuit, and more particularly, to a charge pump in a PLL circuit.

2. Description of the Related Art

A phase-locked loop (PLL) which in general is a circuit for restoring a clock signal used to modulate or encode an input signal, is used in various applications such as demodulation of a frequency-modulated (FM) signal or a stereo signal, or restoring a signal recorded on a recording medium.

FIG. 1 contains a block diagram of a typical charge pump type PLL circuit. In the PLL circuit of FIG. 1, a phase detector 2 receives a reference signal and detects the phase difference between the reference signal and a signal output from a divider 10. The phase detector 2 outputs a digital voltage, i.e., an up signal UP or a down signal DN, in accordance with the difference in the detected phase. The charge pump 4 outputs analog pumping current $I_{pump}$ in accordance with the digital voltage from the phase detector 2. A loop filter 6 receives the pumping current $I_{pump}$, and charges and discharges an internal capacitor in accordance with the pumping current to low-pass filter the pumping current, so that a filtered voltage is output as a control voltage. A voltage controlled oscillator (VCO) 8 receives the control voltage and produces an oscillation signal having a frequency corresponding to the control voltage. The divider 10 is selectively used and divides the oscillation signal output from the VCO 8 to output the divided signal to the phase detector 2.

In a clock recovery PLL for recovering a non return-to-zero (NRZ) type clock signal, a Hogge Phase Detector is typically used. FIG. 2 shows an example of signals in a PLL employing the Hogge Phase Detector. Assuming that the input reference signal and the divided oscillation signal have waveforms as shown in FIGS. 2A and 2B, respectively, the up signal UP is a pulse signal having a rising edge at the rising edge of the reference signal and a falling edge at the rising edge of the divided oscillation signal, as shown in FIG. 2C. Also, as shown in FIG. 2D, the down signal DN is a pulse signal having a rising edge at the rising edge of the divided oscillation signal and a falling edge at the falling edge of the divided oscillation signal. In this case, the VCO control signal output from the loop filter 6 has a waveform as shown in FIG. 2E.

If the levels of the pumping currents $I_{pump}$ according to the up and the down signals UP and DN are the same, and the reference signal and the divided oscillation signal are in phase, the rising edge or the falling edge of the divided oscillation signal is accurately matched with the rising edge of the reference signal as shown in FIGS. 2A and 2B. Also, as shown in FIGS. 2C and 2D, the up and down signals UP and DN have the same pulse widths. Thus, charge stored in the loop filter 6 is maintained by a predetermined pattern, so that there is no change in the VCO control voltage.

However, if the levels of the pumping currents $I_{pump}$ according to the up and down signals UP and DN are different, pulse widths of the up and down signals UP and DN are different, as shown in FIGS. 3C and 3D. Also, when the phase is locked, a phase error in which the falling edge of the oscillation signal is mismatched with the rising edge of the reference signal is generated as shown in FIGS. 3A and 3B. Here, if the input signal has jitter, a circuit which demodulates data using the restored clock signal has a high probability of generating errors. FIG. 4A shows a reference signal including jitter, FIG. 4B shows an oscillation signal having phase error, and FIG. 4C shows the bit error rate according to the phase error. If the pumping currents $I_{pump}$ according to the up and down signals UP and DN are different, the jitter tolerance is lowered, thereby increasing the bit error rate.

If a capture range of the PLL or a lock range thereof is large, the frequency range of the input reference voltage is large, as in, for example, the PLL employed for a CD-ROM system or a DVD-ROM system, so that the current offset becomes more severe. For instance, a 24× speed ROM must operate at 16× speed, 8× speed, or less, in accordance with the stored information and the state of the CD-ROM, and thus the frequency range of the reference voltage input to the PLL is large. Also, if a spindle motor is controlled such that the CD-ROM or the DVD-ROM rotates at a constant angular velocity (CAV), the frequency range of the reference voltage is increased.

As described above, it is very important that in the charge pump the levels of the pumping currents $I_{pump}$ in response to the up signal UP and the down signal DN are equalized. Thus, various methods for equalizing current and reducing static phase error in the charge pump have been proposed. One of them is disclosed in U.S. Pat. No. 5,646,563 assigned to National Semiconductor Corporation, entitled, "Charge Pump with Near Zero Offset Current."

In the conventional approaches, although current matching is improved, the current cannot be completely, i.e., 100% matched. This is because the current in a saturation mode varies in accordance with a gate-source voltage $V_{GS}$ or a base-emitter voltage $V_{BE}$ of a transistor, instead of having a constant level. Also, even if the current is completely matched, the electric potential of the VCO control voltage can change when the widths of the up signal UP and the down signal DN output from a phase detector are the same. This is because delay paths in which the up signal UP and the down signal DN output from the phase detector operate in the charge pump may be different in the layout level stage, and switches opened and closed by the signals have various characteristics. Also, since distributions of current levels are different in processes, it is difficult to equalize two currents in the charge pump with each other.

SUMMARY OF THE INVENTION

To solve the above problems, it is an object of the present invention to provide a phase-locked loop systematically compensating a deviation of pumping current output by a charge pump, to thereby reduce the current deviation in accordance with process distribution.

Accordingly, to achieve the above objective, in a charge pump according to the present invention, a first current source supplies a first current through first and second channels, and a second current source supplies a second current through third and fourth channels. First switching means is connected between the output node and the first channel of the first current source and is turned on in response to the first signal to output the first current as the first pumping current through the output node. A second switching means is connected between the output node and the third channel of the second current source and is turned on in response to the second signal to output the second pumping current through the output node. A current control means is connected to the second channel of the first current source and the fourth channel of the second current source and controls the second current source such that the first pumping current level in activation is equal to the second pumping current level in activation.

In one embodiment of the present invention, the current control means receives the first current and the second current from the second channel of the first current source and the fourth channel of the second current source, respectively. The current control means generates the current control signal in accordance with the difference between the first current and the second current and supplies the generated current control signal to the second current source, to thereby control the second current source such that the first pumping current level in activation is equal to the second pumping current level in activation.

Also, in one embodiment of the present invention, the current control means includes a first control transistor, a second control transistor, charge storing means, a comparator, smoothing means, and a sampling transistor. The first control transistor has a source connected to the second channel of the first current source, and a drain connected to the control node, and is turned on in response to a first switching signal to transmit the first current input from the second channel to the control node. The second control transistor has a source connected to the fourth channel of the second current and a drain connected to the control node, and is turned on in response to a second switching signal to transmit the second current input from the fourth channel to the control node. The charge storing means has one terminal connected to the control node and the other connected to a ground. The comparator compares a voltage of the control node with a predetermined reference voltage and outputs a compared signal in accordance with the comparison results. The smoothing means smooths the compared signal to generate the current control signal. The sampling transistor has a source connected to an output terminal of the buffer, a drain connected to the control node, and is turned on in response to a predetermined sampling signal.

In another embodiment of the present invention, the current control means includes a common node forming a common path connected to the second channel of the first current source and the fourth channel of the second current source such that the same current flows in the second channel and the fourth channel, and generates a control signal such that the voltage of the output node is equal to that of the common node and supplies the generated control signal to the second current source, to thereby control the second current source such that the level of the first pumping current in activation is equal to the second pumping current level in activation.

In another embodiment of the present invention, the current control means includes a first transistor, a second transistor and an operational amplifier. The first transistor has a source connected to the second channel of the first current source, a drain connected to the common node and a grounded gate. The second transistor has a source connected to the fourth channel of the second current source, a drain connected to the common node and a gate to which a power supply voltage is applied. The operational amplifier has a first input terminal connected to the common node, a second input terminal connected to the output node and an output terminal outputting the control signal.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 is a block diagram of a conventional charge pump type phase-locked loop (PLL) circuit.

FIGS. 2A through 2D show an example of signals when pumping currents according to up and down signals are the same, in a PLL employing a Hogge Phase Detector.

FIGS. 3A through 3D show an example of signals when pumping currents according to up and down signals are different, in the PLL employing Hogge Phase Detector.

FIGS. 4A through 4C show a bit error rate during processing of input data when a reference signal input to the PLL having a phase error has jitter.

FIGS. 6A through 6C are waveform diagrams of a sampling signal, first and second timing signals, and FIGS. 6D and 6E show the on and off states of control pull-up and pull-down transistors in accordance with first and second timing signals.

FIGS. 7A through 7C are waveform diagrams of an output signal, a comparing signal and a control signal of a low pass filter if the levels of pull-up and pull-down current are the same.

FIGS. 8A through 8C are waveform diagrams of an output signal, a comparing signal and a control signal of a low pass filter when the pull-down current is higher than the pull-up current.

DESCRIPTION OF THE PREFERRED EMBODIMENTS

Figure 5:
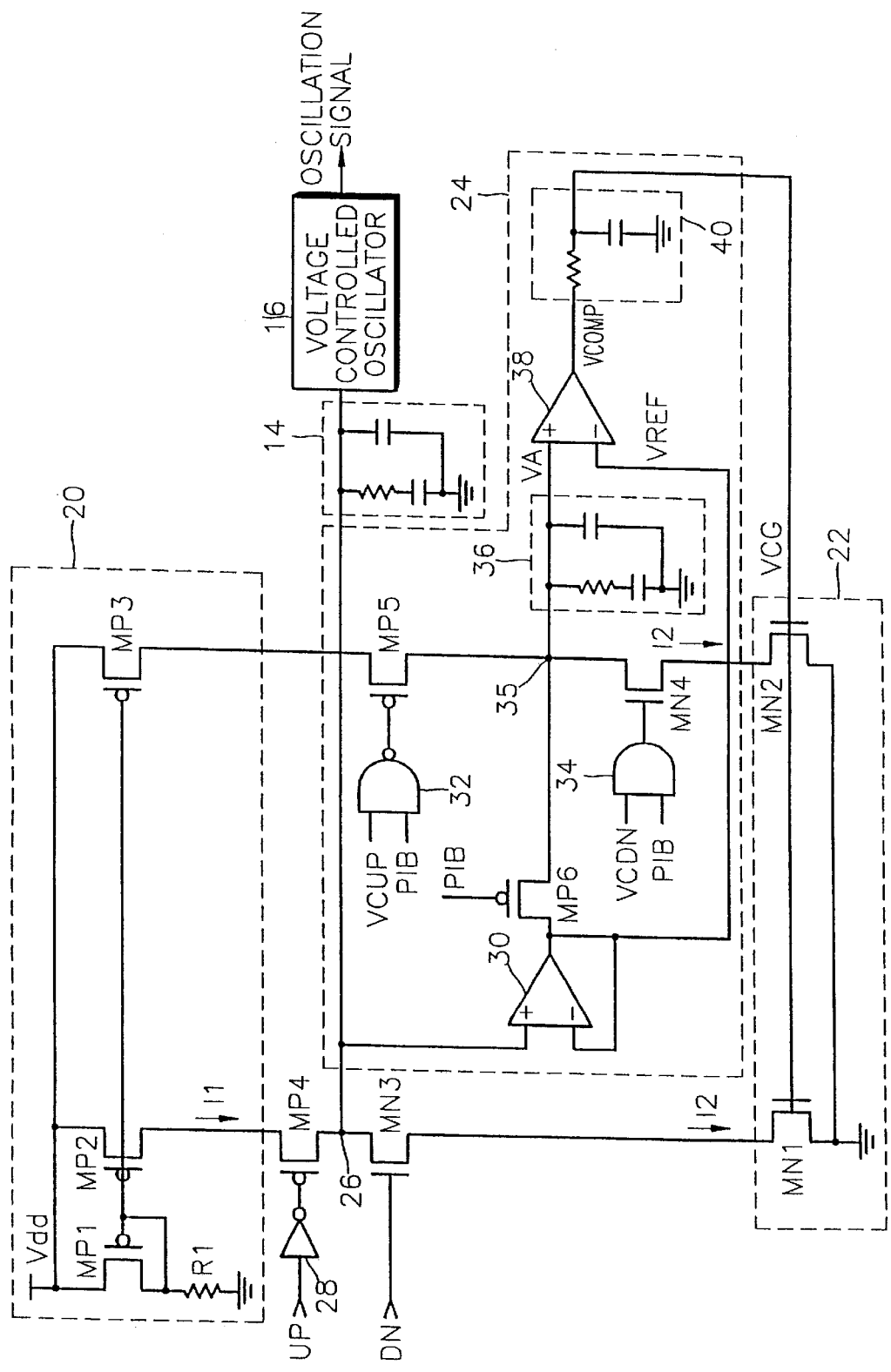
FIG. 5 is a circuit diagram showing a first embodiment of a charge pump of a phase-locked loop according to the present invention.

FIG. 5 is a circuit diagram showing a first embodiment of a charge pump of a phase-locked loop according to the present invention. The charge pump includes a first current source 20, a second current source 22, a pull-up transistor MP4, a pull-down transistor MN3 and a current controller 24. A loop filter 14 and a voltage controlled oscillator (VCO) 16 are also shown in FIG. 5. The charge pump receives up and down signals UP and DN from a phase detector (not shown), and outputs pull-up pumping current and pull-down pumping current to the loop filter 14 through an output node 26 in response to the up and down signals UP and DN.

In one embodiment of the present invention, the first current source 20 includes three PMOS transistors MP1, MP2, MP3 composing a current mirror. Sources of transistors MP1, MP2 and MP3 are connected to a power supply voltage Vdd, and gates thereof are connected to each other. The drain of the transistor MP1 is grounded through resistor RI. The current from the source of the transistor MP1 to the drain thereof is mirrored in the transistors MP2 and MP3. Thus, when a current path passing through drains of the transistors MP2 and MP3 is formed, current I1 of the same level flows through the drains of the transistors MP2 and MP3.

The second current source 22 includes two NMOS transistors MN1 and MN2. The sources of the transistors MN1 and MN2 are grounded. Also, a current control voltage VCG is applied to the gates of the transistors MN1 and MN2. Thus, when a current path passing through the drains of the transistors MN1 and MN2 is formed, current I2 having a level determined by the current control voltage VCG flows in common through the drains of the transistors MN1 and MN2.

The source of the pull-up transistor MP4 is connected to the drain of the transistor MP2, and the drain is connected to the output node 26. Also, the up signal UP from the phase detector is applied to the gate of the pull-up transistor MP4 through an inverter 28. Thus, when the level of the up-signal UP is logic high, the pull-up transistor MP4 is turned on, to thereby output the current flowing from the transistor MP2 as the pull-up pumping current to the output node.

The source of the pull-down transistor MN3 is connected to the drain of the transistor MN1, and the drain is connected to the output node 26. Also, the down-signal DN is applied to the gate of the pull-down transistor MN3. Thus, when the level of the down-signal DN is logic high, the pull-down transistor MN3 is turned on, to thereby output the current I2 received from the transistor MN1 as pull down pumping current to the output node 26. Here, the current flowing through the pull-down transistor MN3 is negative, so that the pull-down pumping current flows from the output node 26 to the second current source 22. Thus, as described above, the charge pump outputs pull-up pumping current and pull-down pumping current, in response to the up-signal UP and the down-signal DN, to the loop filter 14 through the output node 26.

The current controller 24 receives current I1 of the transistor MP3 of the first current source 20 and current I2 of the transistor MN2, and outputs a control signal VCG controlling the second current source 22 such that the level of the current I2 is the same as that of the current I1. In the current controller 24, a NAND gate 32 receives a first timing signal VCUP and a sampling signal PIB, and outputs the results of the NAND operation to the gate of a control pull-up transistor MP5. The source of the transistor MP5 is connected to the drain of the transistor MP3 of the first current source 20, and the drain is connected to a node 35.

An AND gate 34 receives a second timing signal VCDN and the sampling signal PIB, and outputs the results of the AND operation to the gate of a control pull-down transistor MN4. The source of the transistor MN4 is connected to a drain of the transistor MN2 of the second current source 22, and the drain is connected to the node 35. Thus, when the level of the output signal of the AND gate 34 is logic high, the transistor MN4 is turned on and thus outputs the current I2 received from the transistor MN2 to the node 35.

Waveform diagrams of the sampling signal PIB and the first and the second timing signals VCUP and VCDN according to a first embodiment are shown in FIGS. 6A through 6C, respectively. The sampling signal PIB is obtained by dividing a system clock signal of a system for which the PLL is used, and has a high duty rate. The first timing signal VCUP can be generated by dividing the system clock signal, and the second timing signal VCDN can be generated by inverting the first timing signal VCUP. The on/off states of the control pull-up transistor MP5 and the control pull-down control transistor MN4 in accordance with waveform diagrams of FIGS. 6A through 6C are shown in FIGS. 6D and 6E, respectively. When the levels of sampling signal PIB and the first timing signal VCUP are logic high, the transistor MP5 is turned on, and when the levels of sampling signal PIB and the second timing signal VCDN are logic high, the transistor MN4 is turned on.

A low-pass filter 36 is charged and discharged by the pull-up and pull-down current flowing through the transistors MP5 and MN4, respectively. A comparator 38 compares an output signal VA of the low-pass filter 36 with a reference voltage VREF and thus outputs a compared signal VCOMP in accordance with the compared results. An integrator 40 integrates the compared signal VCOMP and outputs the integrated signal as the control signal VCG with respect to the second current source 22.

A buffer 30 copies an output voltage level, without effect to the output voltage level, of the output node 26. A transistor MP6 periodically transmits an output voltage level copied through the buffer 30 to the node 35 in response to the sampling signal PIB.

Hereinafter, operation of the current controller 24 will be described in detail. When the transistor MP5 is turned on, the current I1 flowing through the transistor MP3 charges the low band-pass filter 36. Also, when the transistor MN4 is turned on, the current I2 flowing through the transistor MN2 discharges the low-pass filter 36. The transistors MP5 and MN4 are alternately turned on and off by the NAND gate 32 and the AND gate 34, so that the low-pass filter 36 is repeatedly charged and discharged. In a preferred embodiment, the pass band center frequency $f_c$ of the filter 36 is sufficiently set to high frequency, so that the output voltage VA of the low-pass filter 36 has a big ripple component. That is, the output signal VA of the low pass filter 36 has a shape similar to a triangular wave or a sinusoidal wave having a narrow peak portion and a wide center portion.

The comparator 38 compares the output signal VA of the low-pass filter 36 with the reference voltage VREF, and outputs a compared signal VCOMP according to the comparison result. In one embodiment, the reference voltage VREF is the output voltage of the output node 26 copied by the buffer 30. But, when the level of the output signal VA of the low-pass filter 36 is higher than the level of the reference voltage VREF, the level of the compared signal VCOMP output by the comparator 38 is logic high. When the level of the output signal VA of the low-pass filter 36 is lower than the level of the reference voltage VREF, the level of the compared signal VCOMP output by the comparator 38 is logic low.

If the level of the pull-up current I1 is the same as that of the pull-down current I2, the output signal VA of the low-pass filter 36 has a waveform as shown in FIG. 7A. In this case, the compared signal VCOMP output by the comparator 38 has a waveform as shown in FIG. 7B. Also, the control signal VCG output by the integrator 40 is maintained at a predetermined level as shown in FIG. 7C. Thus, the second current source 22 in a normal state supplies the constant pull-down current I2.

If the pull-down current is higher than the pull-up current, waveforms of the output signal, the compared signal and the control signal of the low-pass filter 36 are as shown in FIGS. 8A through 8C, respectively. At this time, since the amount of discharging is more than the amount charging in each charge and discharge cycle, the output signal VA of the low-pass filter 36 gradually decreases whenever one charge and discharge cycle passes as shown in FIG. 8A. Thus, as shown in FIG. 8B, the interval in which the compared signal VCOMP output by the comparator 38 is high is gradually reduced, and the interval in which the compared signal VCOMP output by the comparator 38 is low, is increased, so that the duty rate is lowered. That is, a pulse width modulation (PWM) signal is generated in accordance with a difference between the pull-up current I1 and the pull-down current I2. At this time, the control signal VCG output from the integrator 40 is also reduced. As the control signal VCG gets smaller, the level of the pull-down current I2 supplied by the second current source 22 gets smaller, and thus the level of the pull-down current I2 is the same as that of the pull-up current I1.

If the pull-down current is smaller than the pull-up current, the current controller 24 operates in a manner similar to the above operation. That is, the output signal VA of the low-pass filter 36 gradually rises whenever one charge and discharge cycle passes, and the duty rate of the compared signal VCOMP increases. Here, the control signal VCG output by the integrator 40 increases, and thus the level of the pull-down current I2 is increased.

As described above, if the level of the pull-down current is different from that of the pull-up current, the current controller 24 supplies the control signal to the second current source 22, so that the level of the pull-down current is the same as that of the pull-up current. Also, an adaptive control process of an adaptive loop including the current controller 24 and the second current source 22 can compensate for a difference in a delay path between the up signal UP and the down signal DN output from the phase detector. That is, since paths transmitting the up-signal UP and the down-signal DN to the pull-up transistor and a pull-down transistor in the charge pump are different, even though the effective duty cycles of the up signal UP and the down signal DN are different, the current controller 24 can compensate for the difference.

The transistor MP6 of FIG. 5 periodically samples the output signal of the buffer 30 and outputs the sampled voltage to the node 35, and thus suppresses deviation of the voltage level of the node 35 from the output node 26. Thus, the transistor MP6 increases stability of the current controller 24 and the charge pump circuit.

Figure 9:
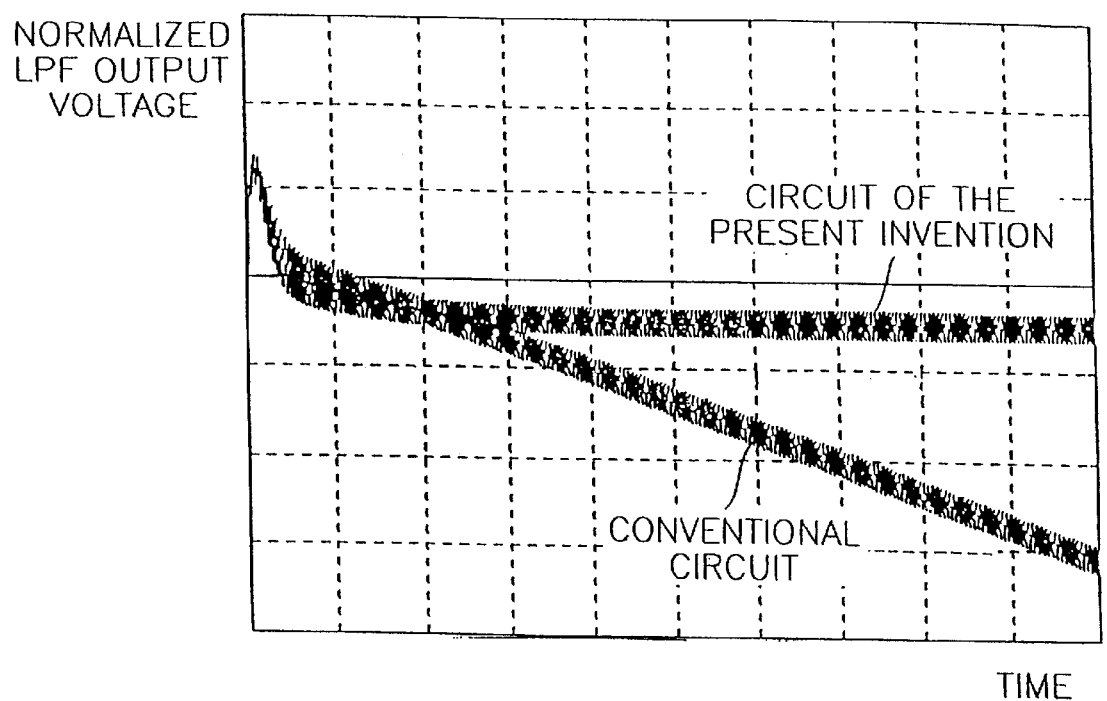
FIG. 9 is a graph of simulation results of the charge pump according to the first embodiment of present invention and the conventional charge pump.

FIG. 9 shows the results of simulation with respect to the charge pump according to the above described embodiment of the present invention and a conventional charge pump. In the simulation of FIG. 9, it is assumed that the duty cycles of the up signal UP and the down signal DN output by the phase detector are 50% and 51%, respectively. Thus, since the duty cycles between the up signal UP and the down signal DN are different, it is shown that the output voltage of a loop filter 14 is reduced in the conventional charge pump. Meanwhile, in the charge pump of the present invention, the difference in duty cycles between the up signal UP and the down signal DN is adaptively compensated, so that the output voltage of the loop filter 14 which is a little changed during an initial transient response period, is stabilized for a while.

The above description is for one embodiment of the present invention. The present invention is not limited to the illustrated embodiment and many changes and modifications can be made. For example, in the above described embodiment, the current controller 24 which controls supply current of the second current source 22 in the above embodiment can control the supply current of the first current source 20 in another embodiment of the present invention.

Figure 10:
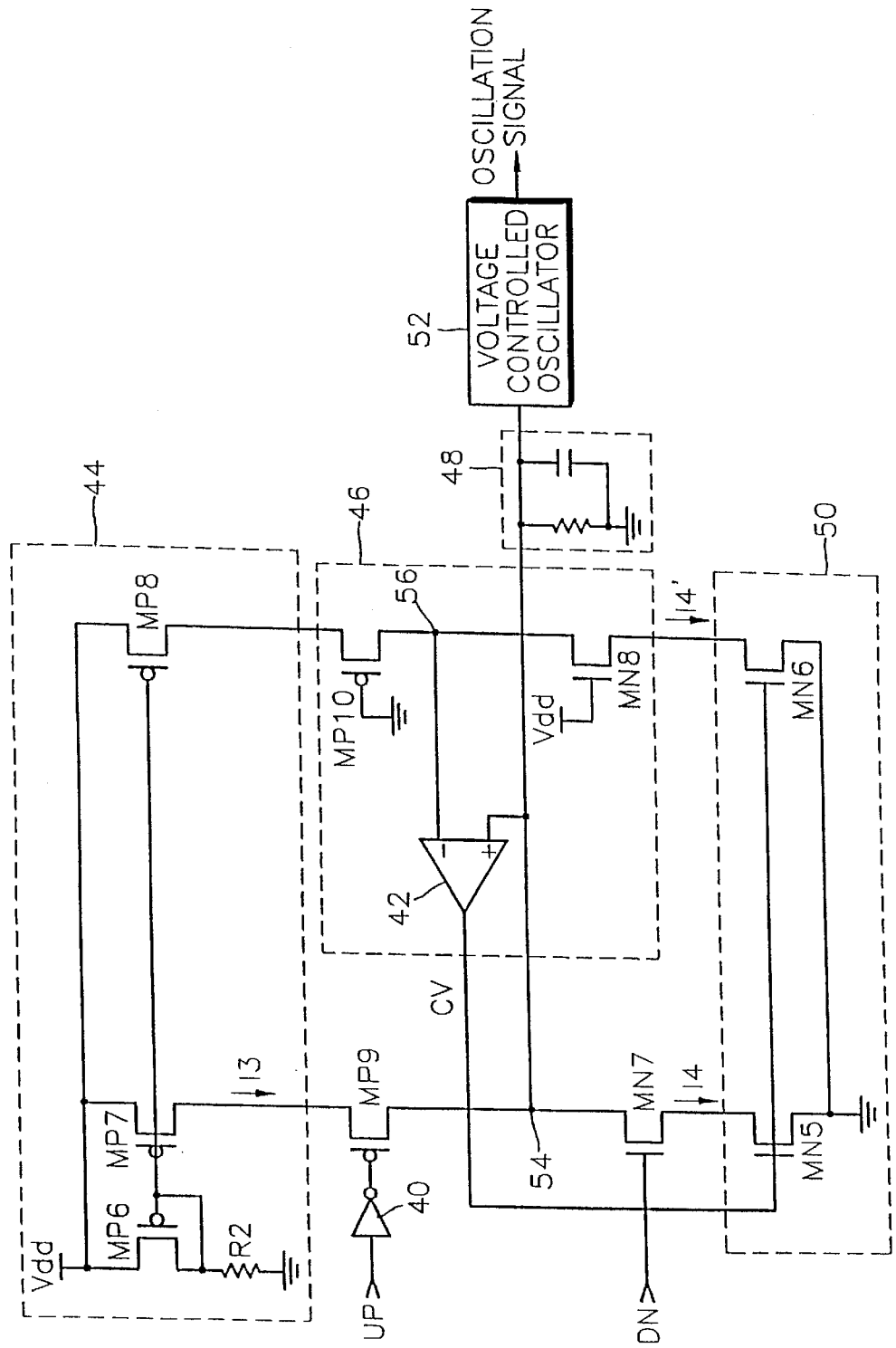
FIG. 10 is a circuit diagram of an alternative embodiment of a charge pump of a phase-locked loop according to the present invention.

FIG. 10 is a circuit diagram of an alternative embodiment of a charge pump of a phase-locked loop according to the present invention. The charge pump of FIG. 10 includes a first current source 44, a second current source 50, a pull-up transistor MP9, a pull-down transistor MN7 and a current controller 46. A loop filter 48 and a voltage controlled oscillator (VCO) 52 are shown together in FIG. 10 for convenience. The charge pump receives up signal UP and down signal DN from a phase detector (not shown), and pull-up pumping current and pull-down pumping current are output to the loop filter 48 through the output node 54 in response to the up signal UP and the down signal DN.

In this embodiment of the present invention, the first current source 44 includes three PMOS transistors MP6, MP7 and MP8 composing a current mirror. Sources of the transistors MP6, MP7 and MP8 are connected to a power supply voltage Vdd, and gates thereof are connected to each other. A drain of the transistor MP6 is grounded through a resistor R2 Current flowing to the drain from the source of the transistor MP6 is mirrored in the transistors MP7 and MP8, so that an equal current I3 flows through the drains of the transistors MP7 and MP8 when the current path passing through the drain of the transistors MP7 and MP8 is formed.

The second current source 50 includes two NMOS transistors MN5 and MN6. Sources of the transistors MN5 and MN6 are grounded. Also, a control signal CV is applied to the gates of the transistors MN5 and MN6. Thus, the level of the current I4' flowing through the drain of the transistor MN6 is controlled by the control voltage CV.

The pull-up transistor MP9 has a source connected to the drain of the transistor MP7, and a drain connected to the output node 54. Also, the up signal UP of a phase detector (not shown) is applied the gate of the pull-up transistor MP9 through the inverter 40. Thus, the pull-up transistor MP9 is turned on when the up signal UP has a high level, so that the current flowing from the transistor MP7 as pull-up pumping current is output to the output node 54.

The pull-down transistor MN7 has a source connected to the drain of the transistor MN5, and a drain connected to the output node 54. Also, a down signal DN is applied to a gate of the pull-down transistor MN7. Thus, when the level of the down signal DN is logic high, the pull-down transistor MN7 is turned on, the current I4 flows from the transistor MN5 as pull-down pumping current and is output to the output node 54. Here, the current flowing through the pull-down transistor MN7 has a negative level, so that the pull-down pumping current flows to the second current source 50 from the output node 54. Thus, as described above, the charge pump outputs a pull-up pumping current and a pull-down pumping current corresponding to the up signal UP and the down signal DN in response to the up signal UP and the down signal DN through the output node 54.

The current controller 46 receives current I3 from the transistor MP8 of the first current source 44 and current I4' from the transistor MN6 of the second current source 50, and includes a common node 56 such that the level of the current I4' is equal to the level of the current I3. Also, the current controller 46 includes a transistor MP10 having a source connected to the drain of the transistor MP8, a drain connected to the common node 56 and a grounded gate. The current controller 46 also includes a transistor MN8 having a source connected to the drain of the transistor MN6, a drain connected to the common node 56 and a gate to which a power supply voltage Vdd is applied. A comparator 42 includes an inverting input terminal connected to the common node 56, a non-inverting input terminal connected to the output node 54 and an output terminal connected to the second current source 50. The comparator 42 outputs a control voltage CV to the second current source 50 such that the voltage of the output node 54 is equal to that of the common node 56. Here, gate voltages of the transistors MP10 and MN8 are locked at the ground and the power supply voltage Vdd, respectively, which is for corresponding the characteristic in which the transistor MP9 or MN7 is turned on by the up signal UP or the down signal DN output from a phase comparator (not shown) to the operation characteristic.

Hereinafter, operation of the charge pump according to this alternative embodiment of the present invention will be described. In the charge pump using a reference current source and a current mirror source, the drain-source voltage of the reference current source is different from that of the current mirror source. That is, in FIG. 10, the output node 54 is connected to the loop filter 48, so that the drain-source voltage of the transistor MN5 is changed. When the drain-source voltage of the transistor MN5 is changed, the level of the drain current $I_d$ is changed. Thus, the level of the pull-up pumping current does not meet with that of the pull-down pumping current, to thereby generate a static phase error of the phase-locked loop, as shown in Equation 1.

$$I_D = K\frac{W}{L}(V_{GS} - V_{TH})^2(1 + \lambda V_{DS}) \qquad (1)$$

Here, L indicates the length of a channel, W indicates the width of the channel, K indicates a process parameter, $V_{GS}$ indicates the gate-source voltage, $V_{TH}$ indicates the threshold voltage, $V_{DS}$ indicates the drain-source voltage, and $1/\lambda$ indicates an early voltage. In Equation 1, as $\lambda$ increases, the drain current $I_D$ increases, so that as $\lambda$ increases, the discordance of the current increases.

In the embodiment of the present invention shown in FIG. 10, a drain-source voltage of the transistor MN5 corresponds to that of the transistor MN6, so that the drain current I4 of the transistor MN5 of the reference current source corresponds to the drain current I4' of the transistor MN6 of the current mirror source, to solve the problem of the discordance of the current. The inverting input terminal of the comparator 42 is connected to the common node 56, and the non-inverting input terminal is connected to the output node 54. The output node 54 is related to the drain-source voltage of the transistors MP7 and MP8, and the common node 56 is related to the drain-source voltage of the transistors MN5 and MN6. The transistors MP9, MP10, MN7 and MN8, which are switches for opening current, have very small resistance during opening, so that they have little effect on voltage loss. The current I3 flowing in the transistor MP8 corresponds to the current I4' flowing in the transistor MN6. This is because the current flowing in the same path is the same, and the transistors MP8 and MN6 are connected to the common node 56 through the transistors MP10 and MN8 to form the same path.

The comparator 42 outputs a control signal CV in accordance with the voltage input to the inverting input terminal and the non-inverting input terminal based on linear characteristics, in a transition interval between logic high and logic low or between logic low and logic high, and changes the gate-source voltage of the transistor MN6 and thus the drain current I4' of the transistor MN6, to perform regulation such that the voltage of the output node 54 is equal to that of the common node 56. Thus, voltages of both input terminals of the comparator 42 in normal operation are the same.

Here, the gates of the transistors MN5 and MN6 are connected to the same node, so that the voltage at each gate is the same. The drain-source voltage $V_{DS}$ is different even though the gate-source voltage $V_{GS}$ is the same, like Equation 1, so that offset in the drain current $I_D$ is generated in the conventional current mirror circuit. However, in the embodiment of the present invention of FIG. 10, the drain-source voltages $V_{DS}$ between the transistor MN5 and the transistor MN6 are the same using the comparator 42, so that $(1+\lambda V_{DS})$ of Equation 1 can be ignored.

Thus, when matching two transistors a unique variable in deciding drain current values of the transistor MN5 and the transistor MN6 becomes a gate-source voltage $V_{GS}$. However, the voltage is a voltage of the same node of FIG. 10, so that the drain current of the transistor MN5 is equal to that of the transistor MN6. That is, the early effect ($\lambda$ effect) can be completely removed. Also, the current I4' flowing in the transistor MN6 and the current I3 flowing in the transistor MP8 are currents flowing in a single path, so that they are the same.

Thus, the pull-up pumping current which is current flowing in the transistor MP7 corresponds to the pull-down pumping current which is current flowing in the transistor MN5, so that the static phase error of the phase-locked loop is seldom generated.

Figure 11:
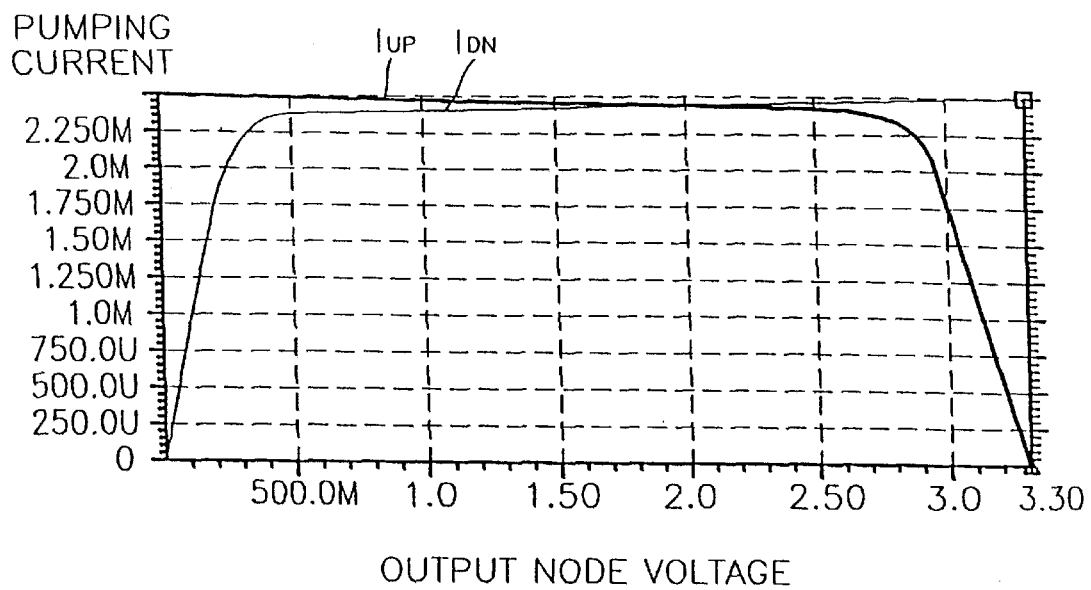
FIG. 11 is a graph of simulation results of a conventional charge pump.
Figure 12:
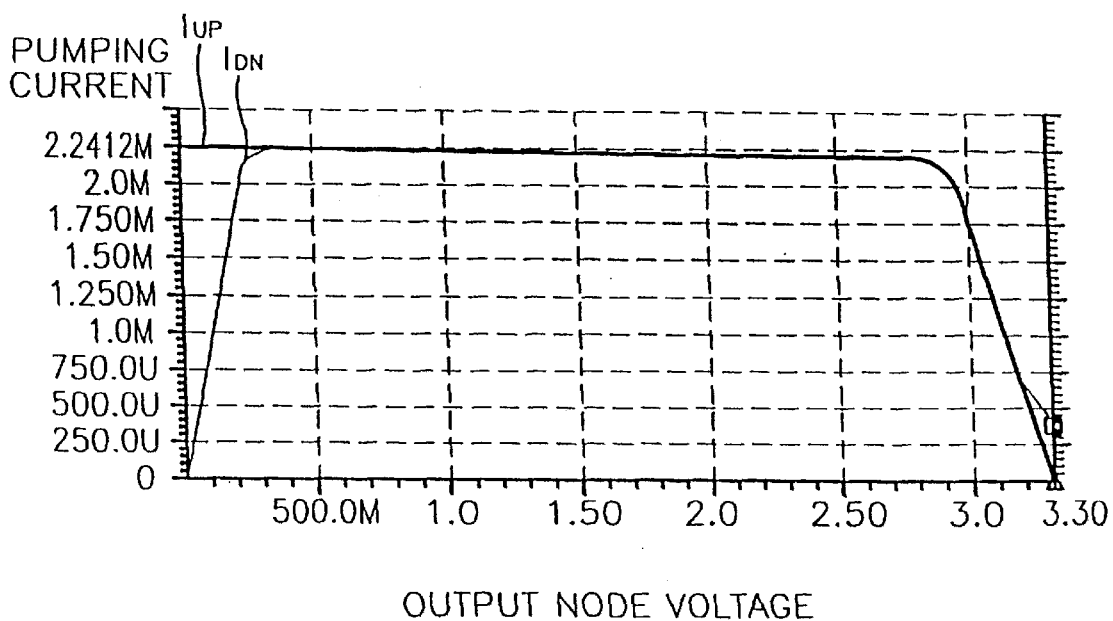
FIG. 12 is a graph of simulation results of a charge pump according to the embodiment of the present invention shown in FIG. 10.

The foregoing description is summarized in Equation 2:

$I_{MP6}=I_{MP7}$ $V_{DS, MN5}=V_{DS, MN6}$ $I_{MP7}=I_{MP8}$ $V_{GS, MN5}=V_{GS, MN6}$ $I_{MN5}=I_{MN6}$ $I_{MP8}=I_{MN6}$ $\therefore I_{MP7}=I_{MN5} \qquad (2)$ FIG. 11 is a graph showing the result of simulation with respect to a conventional charge pump, and FIG. 12 is a graph showing the result of simulation with respect to a charge pump according to the embodiment of the present invention of FIG. 10. As shown in FIGS. 11 and 12, current offset which is generated by the conventional method can be completely removed in the second embodiment of the present invention.

As described above, the charge pump of the present invention systematically compensates for the deviation between the pull-up pumping current and the pull-down pumping current. Also, the difference can be easily compensated even in the case of path delay between the up signal UP and the down signal DN input to the charge pump. Thus, the charge pump can operate stably even when it is applied to a field in which the dynamic range of input data is large, for example, in a CAV type optical drive system. Also, the charge pump of the present invention corrects the current offset of the charge pump in a pipeline manner, so that the offset correction speed and stability are excellent. Also, the structure of the circuit is simplified, so that application of the phase-locked loop can be economical, i.e., the circuit can be adapted to a high-speed clock synchronizer and a data restoring circuit.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A charge pump receiving first and second signals from a phase detector and generating first and second pumping currents according to the first and the second signals, comprising:

an output node;

a first current source supplying a first current through first and second channels;

a second current source supplying a second current through third and fourth channels;

first switching means connected between the output node and the first channel of the first current source, the first switching means being turned on in response to the first signal and outputting the first current as the first pumping current through the output node;

second switching means connected between the output node and the third channel of the second current source, the second switching means being turned on in response to the second signal and outputting the second pumping current through the output node; and current control means connected to the second channel of the first current source and the fourth channel of the second current source, for controlling the second current source such that the first pumping current level in activation is substantially equal to the second pumping current level in activation, wherein the current control means comprises:

a control node;

a first control transistor having a source connected to the second channel of the first current source and a drain connected to the control node, the first control transistor being turned on in response to a first switching signal to transmit the first current input from the second channel to the control node;

a second control transistor having a source connected to the fourth channel of the second current and a drain connected to the control node, the second control transistor being turned on in response to a second switching signal to transmit the second current input from the fourth channel to the control node;

charge storing means having one terminal connected to the control node and the other connected to a ground;

a comparator comparing a voltage of the control node with a predetermined reference voltage and outputting a compared signal in accordance with the comparison results; and smoothing means for smoothing the compared signal to generate the current control signal.

2. The charge pump of claim 1, wherein the current control means (i) receives the first current and the second current from the second channel of the first current source and the fourth channel of the second current source, respectively, (ii) generates the current control signal in accordance with the difference between the first current and the second current, and (iii) supplies the generated current control signal to the second current source, to thereby control the second current source such that the first pumping current level in activation is equal to the second pumping current level in activation.

3. The charge pump of claim 1, wherein the current control means further comprises a buffer receiving a voltage of the output node and outputting the received voltage as the predetermined reference voltage.

4. The charge pump of claim 3, wherein the current control means further comprises a sampling transistor having a source connected to the output terminal of the buffer and a drain connected to the control node, the sampling transistor being turned on in response to a predetermined sampling signal.

5. The charge pump of claim 4, wherein the current control means further comprises:

first logic operation means receiving a first timing signal and the sampling signal and performing a logic operation on the first timing signal and the sampling signal, such that the first control transistor is turned on when the first timing signal and the sampling signal are enabled; and second logic operation means receiving a second timing signal inverse to the first timing signal and the sampling signal and performing a logic operation on the second timing signal and the sampling signal, such that the second control transistor is turned on when the second timing signal and the sampling signal are enabled.

6. A phase-locked loop (PLL) comprising:

a phase detector detecting the phase difference between an input signal and an oscillation signal and outputting first and second signals in accordance with the phase difference;

a charge pump generating first and second pumping currents in accordance with the first and the second signals;

a loop filter receiving the first and the second pumping currents and low-pass filtering the received pumping currents to generate an oscillation control voltage; and a voltage controlled oscillator outputting the oscillation signal in response to the oscillation control voltage, wherein the charge pump comprises:

an output node;

a first current source supplying a first current through first and second channels;

a second current source supplying a second current through third and fourth channels;

first switching means connected between a first channel of the first current source and the output node, the first switching means being turned on in response to the first signal to output the first current as the first pumping current through the output node;

second switching means connected between the output node and a third channel of the second current source, the second switching means being turned on in response to the second signal to output the second current as the second pumping current through the output node; and current control means (i) receiving the first and the second current through the second channel of the first current source and the fourth channel of the second current source, respectively, (ii) generating a current control signal in accordance with the difference between the first current and the second current, and (iii) supplying the generated current control signal to the second current source, to thereby control the second current source such that the first pumping current level in activation is equal to the second pumping current level in activation, wherein the current control means comprises:

a control node;

a first control transistor having a source connected to the second channel of the first current source and a drain connected to the control node, the first control transistor being turned on in response to a first switching signal to transmit a first current input from the second channel to the control node;

a second control transistor having a source connected to the fourth channel of the second current and a drain connected to the control node, the second control transistor being turned on in response to a second switching signal to transmit a second current input from the fourth channel to the control node;

charge storing means having one terminal connected to the control node and the other connected to a ground;

a comparator comparing a voltage of the control node with a predetermined reference voltage and outputting a compared signal according to the comparison results; and smoothing means for smoothing the compared signal to generate the current control signal.

7. The PLL of claim 6, wherein the current control means further comprises a buffer receiving a voltage of the output node and outputting the received voltage as the predetermined reference voltage.

8. The PLL of claim 7, wherein the current control means further comprises a sampling transistor having a source connected to an output terminal of the buffer and a drain connected to the control node, the sampling transistor being turned on in response to a sampling signal.

9. The PLL of claim 8, wherein the current control means further comprises:

first logic operation means receiving a first timing signal and the sampling signal and performing a logic operation on the first timing signal and the sampling signal, such that the first control transistor is turned on when the first timing signal and the sampling signal are enabled; and second logic operation means receiving a second timing signal reverse to the first timing signal and the sampling signal and performing logic operation on the second timing signal and the sampling signal, such that the second control transistor is turned on when the second timing signal and the sampling signal are enabled.

* * * * *